(12) United States Patent
Uemura et al.

(10) Patent No.: US 7,580,443 B2
(45) Date of Patent: Aug. 25, 2009

(54) CLOCK GENERATING METHOD AND CLOCK GENERATING CIRCUIT

(75) Inventors: Yasuhiro Uemura, Sagamihara (JP);
Takashi Nakamura, Kokubunji (JP);
Akio Katsushima, Kodaira (JP);
Makoto Funatsu, Akiruno (JP)

(73) Assignee: Renesas Technology Corp., Tokyo (JP)

( * ) Notice: Subject to any disclaimer, the term of this patent is extended or adjusted under 35 U.S.C. 154(b) by 596 days.

(21) Appl. No.: 11/331,154

(22) Filed: Jan. 13, 2006

(65) Prior Publication Data
US 2006/0176933 A1 Aug. 10, 2006

(30) Foreign Application Priority Data
Jan. 14, 2005 (JP) ............................. 2005-007422

(51) Int. Cl.
*H04B 1/69* (2006.01)
(52) U.S. Cl. .................. 375/130; 375/376; 375/156; 331/10; 331/11; 331/17; 327/156
(58) Field of Classification Search .................. 375/130, 375/376, 156; 331/10, 11, 17, 78; 327/156
See application file for complete search history.

(56) References Cited

U.S. PATENT DOCUMENTS

| 5,488,627 | A | | 1/1996 | Hardin et al. | ................. | 375/204 |
| 5,659,587 | A | * | 8/1997 | Knierim | ....................... | 375/376 |
| 6,980,581 | B1 | * | 12/2005 | Sha et al. | ..................... | 375/130 |
| 7,015,733 | B2 | * | 3/2006 | Giuroiu | ....................... | 327/156 |
| 2005/0008113 | A1 | * | 1/2005 | Kokubo et al. | ............... | 375/376 |
| 2005/0134335 | A1 | * | 6/2005 | Loh | ........................... | 327/156 |

FOREIGN PATENT DOCUMENTS

| JP | 7-235862 | 9/1995 |
| JP | 2001-202153 | 7/2001 |
| JP | 2004-104655 | 4/2004 |

OTHER PUBLICATIONS

K. Hardin et al., "Spread Spectrum Clock Generation for the Reduction of Radiated Emissions," IEEE, 1994, pp. 227-231.
D. Kim et al., "A Spread Spectrum Clock Generation PLL with Dual-tone Modulation Profile," 2005 Symposium on VLSI Circuits Digest of Technical Papers, 2005, pp. 96-99.

* cited by examiner

*Primary Examiner*—Chieh M. Fan
*Assistant Examiner*—Eva Puente
(74) *Attorney, Agent, or Firm*—Miles & Stockbridge P.C.

(57) ABSTRACT

In a clock generating circuit, while a PLL (Phase-Locked Loop) circuit and a modulator are employed, when a frequency dividing ratio of a feedback-purpose frequency divider in the PLL circuit is changed in accordance with modulation data produced based upon a modulation profile of the modulator to perform a frequency modulation so as to spread a spectrum, a turning point of the modulation profile is moved so as to disperse a degree of frequency, so that the spread spectrum is re-spread. Also, a clock generating circuit is constituted by a PLL circuit and a modulator, a multiple modulation profile generating circuit is provided in the modulator, and a turning point of a modulation profile is moved so as to disperse a degree of frequency, so that a spread spectrum is re-spread.

4 Claims, 11 Drawing Sheets

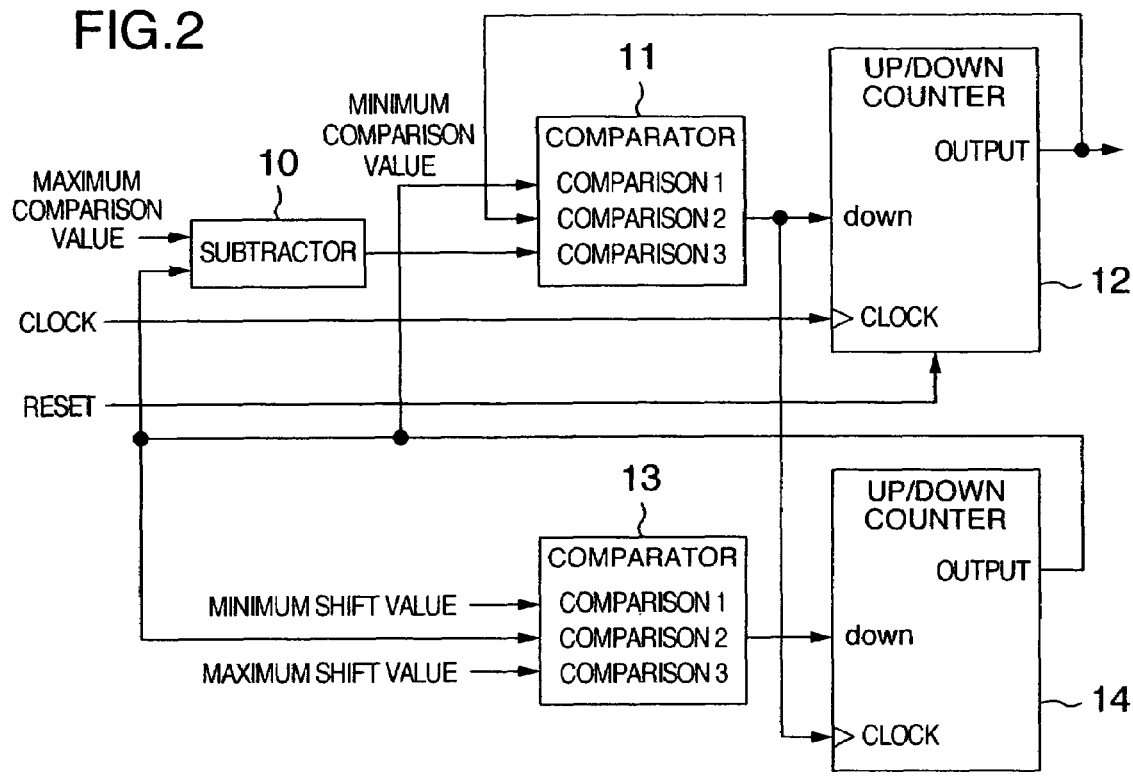
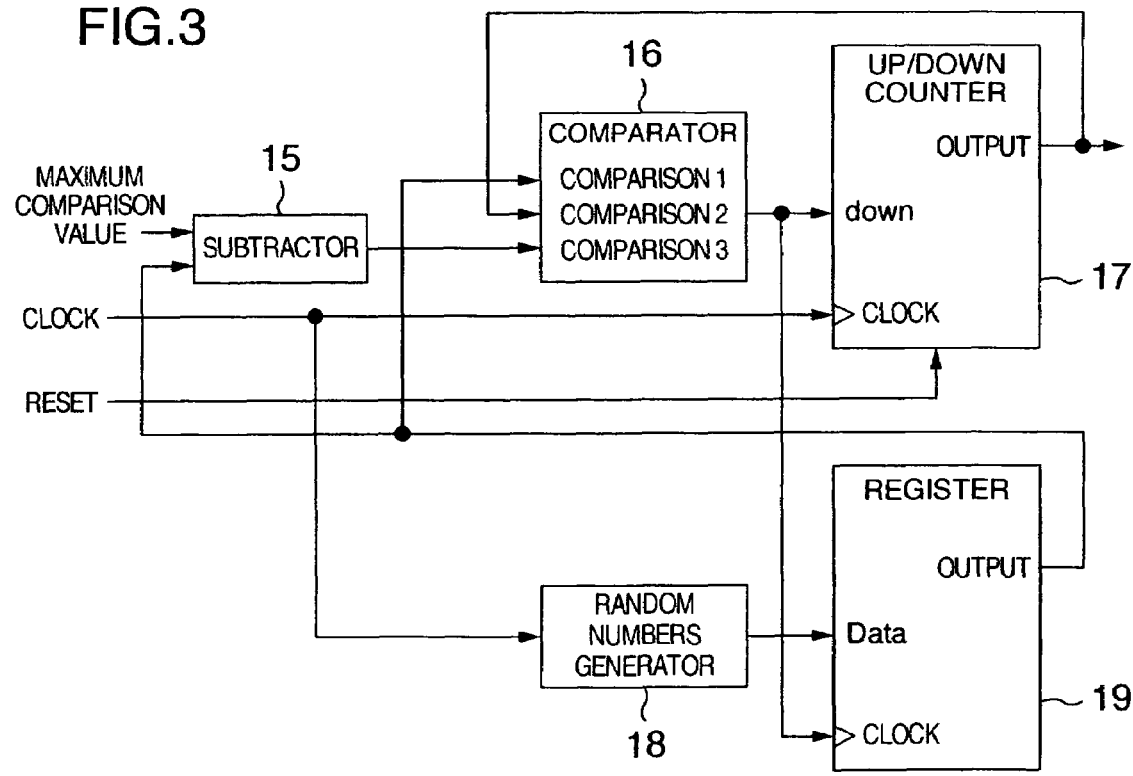

CLOCK GENERATING METHOD AND CLOCK GENERATING CIRCUIT

INCORPORATION BY REFERENCE

The present application claims priority from Japanese application JP2005-007422 filed on Jan. 14, 2005, the content of which is hereby incorporated by reference into this application.

BACKGROUND OF THE INVENTION

The present invention generally relates to a clock generating method and a clock generating circuit. More specifically, the present invention is directed to a circuit technique suitably utilized in an EMI (Electro-Magnetic Interference) technique in the case that clocks are generated by a PLL (Phase-Locked Loop) circuit.

In general, a spectrum spread generating circuit for slightly spreading a spectrum of an oscillating frequency so as to reduce a peak of unwanted electromagnetic radiation is arranged by a PLL (Phase-Locked Loop) circuit and a modulator. The PLL circuit is constituted by a phase frequency comparator, a charge pump, a loop filter, a voltage-controlled oscillator, and a feedback-purpose N frequency divider. While a program counter function capable of changing a frequency dividing ratio is given to the feedback-purpose N frequency divider, the frequency dividing ratio is changed in accordance with a modulation data produced based on a modulation profile generated by the modulator, so that the PLL circuit can realize a spectrum spread. In such a spectrum spread clock oscillator, a modulation profile for performing a frequency modulation is converted by a single dimension (both amplitude and time period are constant) by the modulator, and then, is repeatedly frequency-modulated so as to spread the spectrum. As examples of such a clock generating circuit, U.S. Pat. No. 5,488,627 (corresponding JP-A-7-235862), JP-A-2001-202153, JP-A-2004-104655, and the like have been proposed.

Among systems for realizing spectrum spread operations, in particular, in a spectrum spread clock oscillator in which modulation data produced by a modulator is added to a program counter capable of changing a frequency dividing ratio of a frequency divider arranged in a feedback loop so as to be frequency-modulated, a modulation frequency component corresponding to a modulation profile passes through a loop filter (namely, low-pass filter) of a PLL circuit. As a result, in such a loop filter designed in a band where a higher harmonic component of a modulation frequency cannot pass therethrough, the frequency modulation cannot follow the frequency modulation profile at a turning point and is stagnated, and thus, peaks are produced at both edges of the spectrum waveform after spread spectrum modulation, so that the effect of modulation of the spread spectrum modulation is reduced. Also, in the above-described U.S. Pat. No. 5,488,627, the modulation profile called as "Hershey Kiss" corresponds to such a technical idea that in the waveform where the frequency modulating speed near the turning point is increased, the time duration for which the frequency modulation is stagnated is shortened so as to reduce the peaks produced at both the edges of the spectrum, by which the gentle peak is produced at the center portion, so that the peaks of the overall spectrum are lowered. However, the specific loop filter capable of penetrating therethrough this modulation profile, containing the PLL circuit arranged at the post stage thereof, must be designed.

SUMMARY OF THE INVENTION

An object of the present invention is to provide a clock generating method and a clock generating circuit, capable of effectively realizing a uniform spectrum spread with employment of a simple arrangement. The above-described object and other objects and also a novel feature of the present invention may become apparent from descriptions of the present specification and the accompanying drawings.

A brief explanation is made of typical clock generating methods and circuits disclosed in the present invention. That is, in a clock generating circuit, while a PLL (Phase-Locked Loop) circuit and a modulator are employed, when a frequency dividing ratio of a feedback-purpose frequency divider in the PLL circuit is changed in accordance with modulation data produced based upon a modulation profile of the modulator to perform a frequency modulation so as to spread a spectrum, a turning point of the modulation profile is moved so as to disperse a degree of frequency, so that the spread spectrum is re-spread.

Another typical clock generating method/circuit of the present invention will now be described. That is, another clock generating circuit which is constituted by a PLL circuit, a modulator, and a frequency divider whose dividing ratio is changed in accordance with a modulation profile generated by the modurator and which performs a frequency modulation so as to spread a spectrum to a reference clock, and a turning point of a modulation profile is moved so as to disperse a degree of frequency, so that a spread spectrum is re-spread.

As a consequence, the more uniform spectrum spread can be effectively realized with employment of the simple arrangement.

Other objects, features and advantages of the invention will become apparent from the following description of the embodiments of the invention taken in conjunction with the accompanying drawings.

BRIEF DESCRIPTION OF THE DRAWINGS

FIG. 2 is a schematic block diagram for indicating one embodiment of a multiple modulation profile generating circuit 7 of FIG. 1.

FIG. 3 is a schematic block diagram for indicating another embodiment of the multiple modulation profile generating circuit 7 of FIG. 1.

DESCRIPTION OF THE EMBODIMENTS

Figure 1:
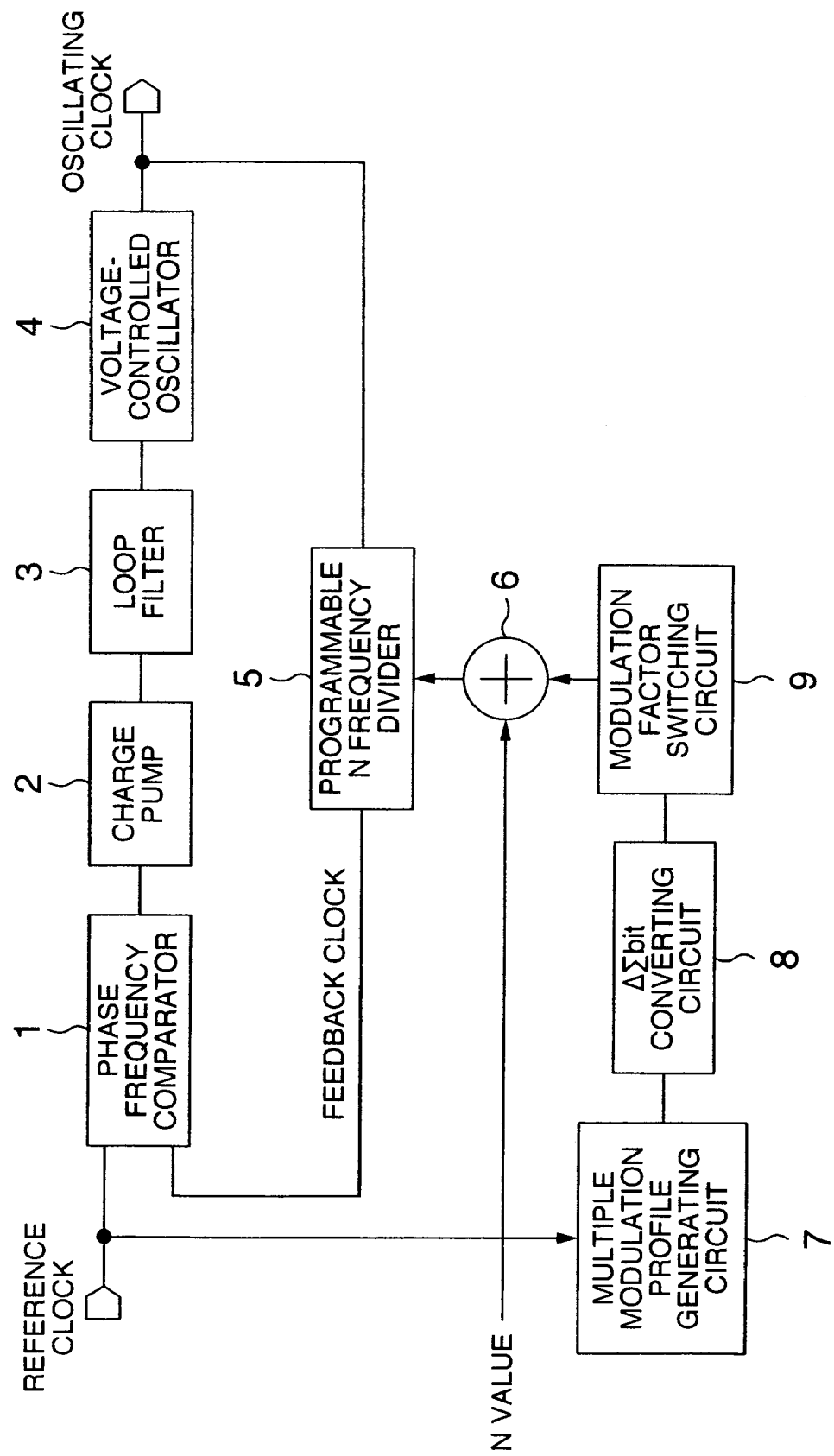
FIG. 1 is a schematic block diagram for showing one embodiment of a clock generating circuit according to the present invention.

FIG. 1 is a schematic block diagram for indicating an example of a clock generating circuit according to the present invention. The clock generating circuit is arranged by both a PLL circuit which is constituted by a phase frequency comparator 1, a charge pump 2, a loop filter 3, a voltage-controlled oscillator 4, and a programmable N frequency divider 5; and a modulator which is constituted by an adder 6, a multiple modulation profile generating circuit 7, a ΔΣbit converting circuit 8, and a modulating factor switching circuit 9.

The phase frequency comparator 1 which constitutes the above-described PLL (Phase-Locked Loop) circuit detects a phase difference between a reference clock and a feedback clock outputted by the programmable N frequency divider 5, and then, outputs either a control signal "UP" or another control signal "DOWN". The control signal "UP" implies such a signal which increases the oscillating frequency of the voltage-controlled oscillator 4 provided at the post stage of the own phase frequency comparator 1. The control signal "DOWN" implies such a signal which decreases the oscillating frequency of the voltage-controlled oscillator 4. The control signals "UP" and "DOWN" outputted by the phase frequency comparator 1 become such signals having pulse widths corresponding to the phase differences between the reference clock and the feedback clock.

Either the control signal "UP" or the control signal "DOWN" outputted by the above-explained phase frequency comparator 1 is converted from a pulse width signal into a voltage signal by the charge pump 2. The charge pump 2 charges/discharges such an electric charge which is equivalent to the pulse width of either the control signal "UP" or the control signal "DOWN". The loop filter 3 corresponds to a circuit which determines a loop bandwidth of the PLL circuit, and is constituted by an RC series circuit. An output voltage of this loop filter 3 is applied as a control voltage to the voltage-controlled oscillator 4. The voltage-controlled oscillator 4 corresponds to such an oscillator capable of changing an oscillating frequency thereof in response to the control voltage, and is constructed of a ring oscillator, and the like.

The output of the voltage-controlled oscillator 4 is inputted to the programmable N frequency divider 5, and constitutes the feedback clock which corresponds to the input signal of the phase frequency comparator 1. The programmable N frequency divider 5 employs such a variable frequency divider which is arranged by that the frequency dividing numbers are switched ever time period of the reference clock. With employment of the above-explained circuit arrangements, the PLL circuit is constituted, so that this PLL circuit can produce an oscillating clock which is obtained by multiplying an averaged frequency dividing number of the programmable N frequency divider 5 by "N" with respect to the reference clock.

In the above-explained embodiment, the frequency dividing number of the above-explained programmable N frequency divider 5 is added to modulation data which is produced based upon the modulated profile of the modulator, and then, the added frequency data is frequency-modulated, so that the spread spectrum may be realized. In other words, while the modulator for controlling the frequency dividing number of the above-described programmable N frequency divider 5 is arranged by the multiple modulation profile generating circuit 7, the ΔΣbit converting circuit 8, and the modulation factor switching circuit 9, the control of the frequency dividing number is carried out based upon such a value obtained by adding the output of the modulator to the averaged frequency dividing number N. The multiple modulation profile generating circuit 7 outputs such a modulated profile used for the frequency spread, which is expressed by a digital value.

FIG. 2 is a block diagram for schematically showing an embodiment of the multiple modulation profile generating circuit 7 of FIG. 1. The multiple modulation profile generating circuit 7 is arranged by a subtractor 10, a comparator 11, an up/down counter 12, another comparator 13, and another up/down counter 14. Each of the comparator 11 and the comparator 13 compares an input value inputted to a comparison 2 with both a minimum value and a maximum value, which are inputted to a comparison 1 and a comparison 3 as reference values. Each of the up/down counter 12 and the up/down counter 14 performs a counting operation of a clock (pulse) which is inputted to a clock terminal in response to a high level/a low level (namely, count up/count down) of a signal inputted to a control input "down".

The above-described up/down counter 12 corresponds to such a circuit which outputs a frequency modulation profile for a frequency spread. Either a count-up operation or a count-down operation of this up/down counter 12 is controlled in response to a switching signal for switching either the count-up operation or the count-down operation, which is outputted by the comparator 11. The comparator 11 corresponds to such a circuit which compares the count output of the up/down counter 12 with a comparison judged value. This comparison judged value is outputted from the up/down counter 14 which produces a re-spread purpose profile used to re-spread a peak of a spread spectrum. In other words, the output value of the up/down counter 14 is supplied to the comparison 1 of the comparator 11, whereas the output value of the subtractor 10 is supplied to the comparison 3 of the comparator 11. Then, a comparison input which is compared with these supplied output values is assumed as the output value of the up/down counter 12.

As a result, the minimum comparison value which is used to switch the up/down counter 12 into the count-up operation is assumed as the output value of the up/down counter 14. Also, the maximum comparison value which is used to switch the up/down counter 12 into the count-down operation is assumed as such a value which is obtained by subtracting the output value of the up/down counter 14 from a maximum value (maximum comparison value) by the subtractor 10.

This maximum value can be outputted by the up/down counter 12. The up/down counter 14 controls either a count-up operation or a count-down operation in response to either the count-up switching signal or the count-down switching signal outputted from the comparator 13. The comparator 13 corresponds to a circuit which compares the output value of the up/down counter 14 with both a minimum shift value and a maximum shift value, which determine a re-spreading range.

In FIG. 1, the ΔΣbit converting circuit 8 corresponds to such a 1-bit pulse width modulating circuit which converts the multiple modulation profile outputted by the multiple modulation profile generating circuit 7 into 1 bit. The modulation factor switching circuit 9 corresponds to such a circuit which switches a modulation factor (frequency spread width) which is determined by the frequency dividing number N and a value added to this frequency dividing number N in response to the output of the above-explained ΔΣbit converting circuit 8. While a spectrum spread clock oscillator is arranged by the above-described circuits, this spectrum spread clock oscillator can generate a re-spread spectrum spread clock by the multiple modulation profile generated by the multiple modulation profile generating unit 7.

Figure 4:
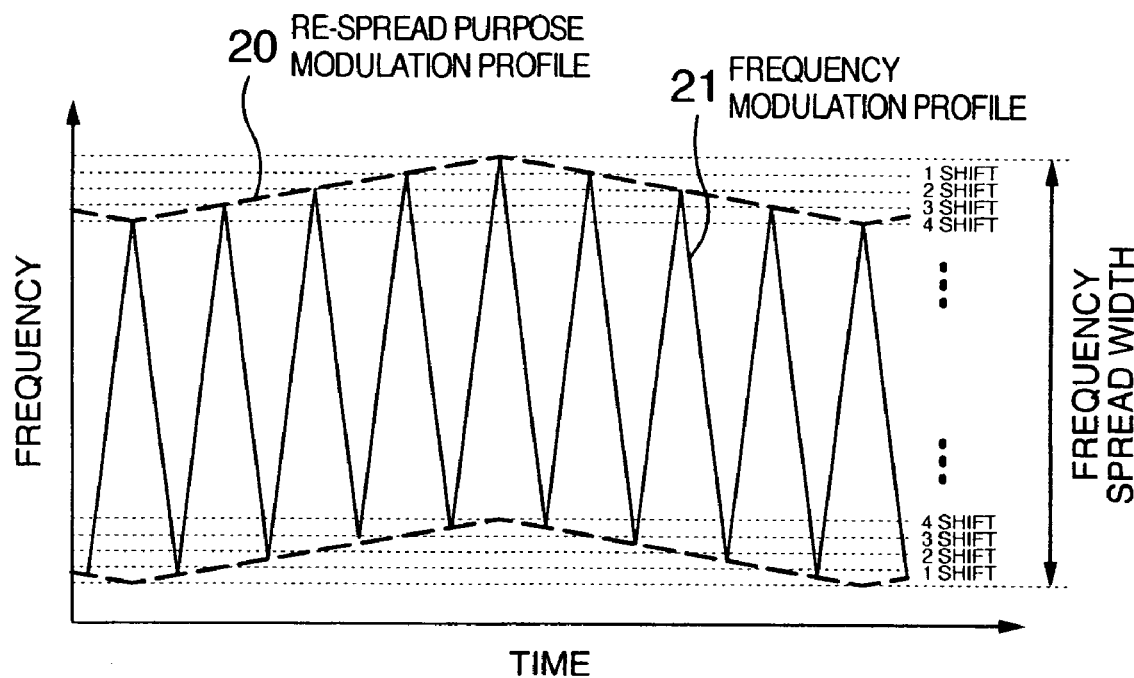
FIG. 4 is an explanatory diagram for explaining a multiple modulation profile which is outputted by the multiple modulation profile generating circuit 7 of FIG. 2.

FIG. 4 is an explanatory diagram for explaining the multiple modulation profile outputted by the multiple modulation profile generating circuit 7 of FIG. 2. Assuming now that a minimum shift value of the multiple modulation profile generating circuit 7 is equal to 0 and a maximum shift value thereof is equal to 4, when a maximum comparison value thereof corresponds to a frequency spread value, a re-spread purpose profile 20 is outputted from the up/down counter 14 whereas a frequency modulation profile 21 is outputted from the up/down counter 12. In other words, the frequency modulation profile 12 formed by the up/down counter 12 is re-spread by the re-spread purpose profile 20 formed by the up/down counter 14.

Figure 7:
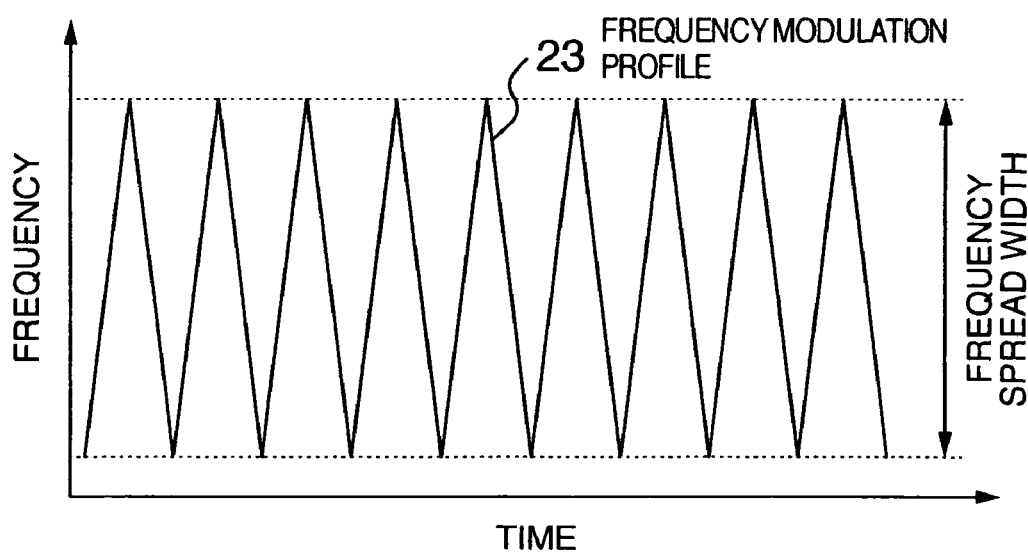
FIG. 7 is an explanatory diagram for explaining a single frequency modulation profile 23.

FIG. 7 shows an explanatory diagram for explaining a single frequency modulation profile 23. In such a case that the above-described up/down counter 14 is not provided, the up/down counter 12 forms such a single frequency modulation profile 23 as shown in FIG. 7. In other words, since both a fixed minimum value and a fixed maximum value are inputted to the comparison 1 and the comparison 3 of the comparator 11, the up/down counter 12 forms such a single frequency (triangular wave)-modulated profile that these fixed minimum and maximum values constitute a frequency spread width.

Figure 8:
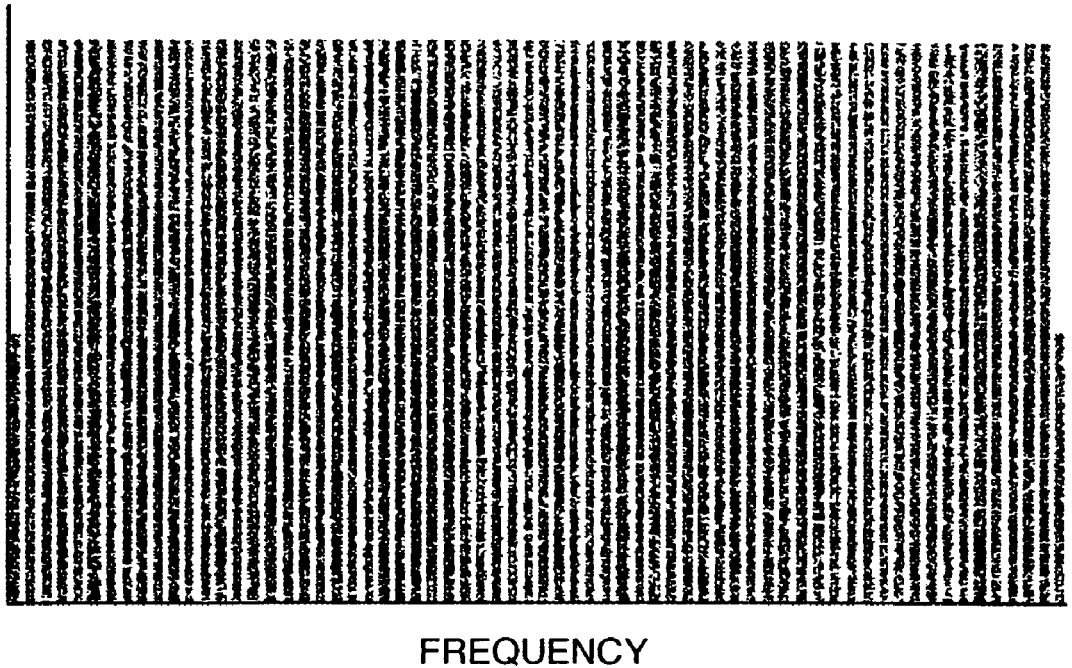
FIG. 8 is an explanatory diagram for explaining a degree of frequency by the single frequency modulation profile 23 of FIG. 7.

FIG. 8 indicates an explanatory diagram for explaining a degree of frequency based upon the single frequency modulation profile 23 shown in FIG. 7. In such a case that a folding degree of the frequency modulation profile 23 is equal to ½ and stagnation of the frequency change modulation occurs, a peak of a spectrum is produced. In order to reduce such a peak of the spectrum, the above-explained multiple modulation profile generating circuit is employed. In other words, the re-spreading operation is carried out by the re-spread profile 20 formed by the up/down counter 14.

Figure 6:
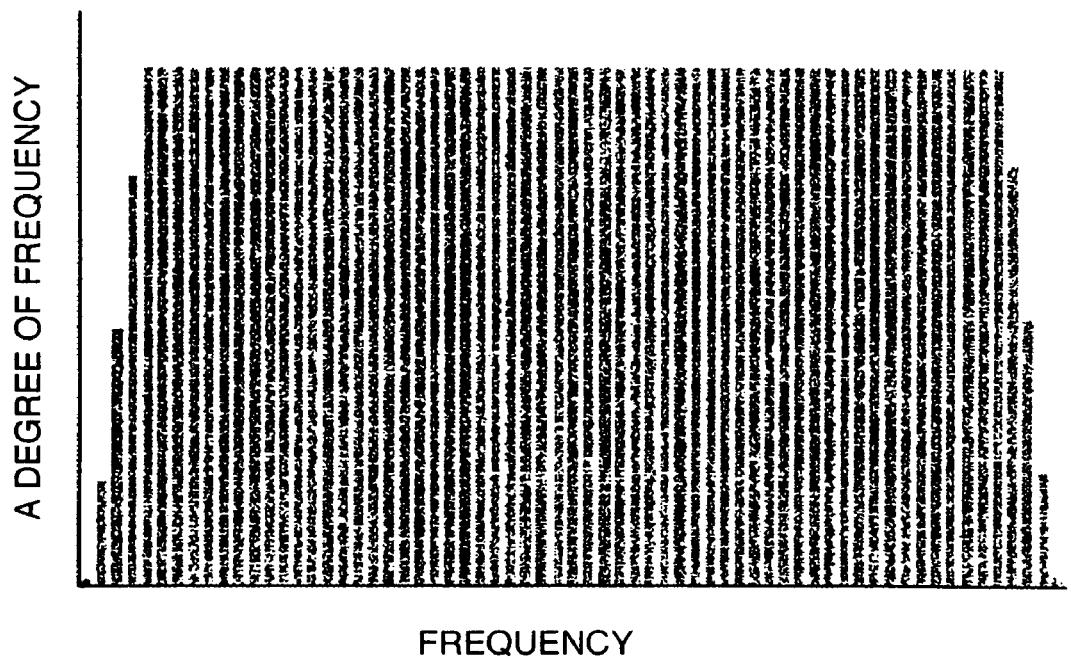
FIG. 6 is an explanatory diagram for explaining a degree of frequency as to the multiple modulation profile outputted from the multiple modulation profile generating circuit 7 according to the present invention.

FIG. 6 is an explanatory diagram for explaining a degree of frequency as to the multiple modulation profile outputted from the multiple modulation profile generating circuit 7 according to the present invention. Based upon the re-spread profile made by the up/down counter 14, the frequency modulation profile is shifted by 4 stages, and also, a turning degree of the frequency modulation profile 21 corresponding to both edges of the frequency spread is reduced to ¼, or smaller than ¼. Since the folding frequency is decreased, the peak of the spectrum which is produced by the stagnation of the frequency change modulation is also reduced to ¼, or smaller than ¼.

Figure 12:
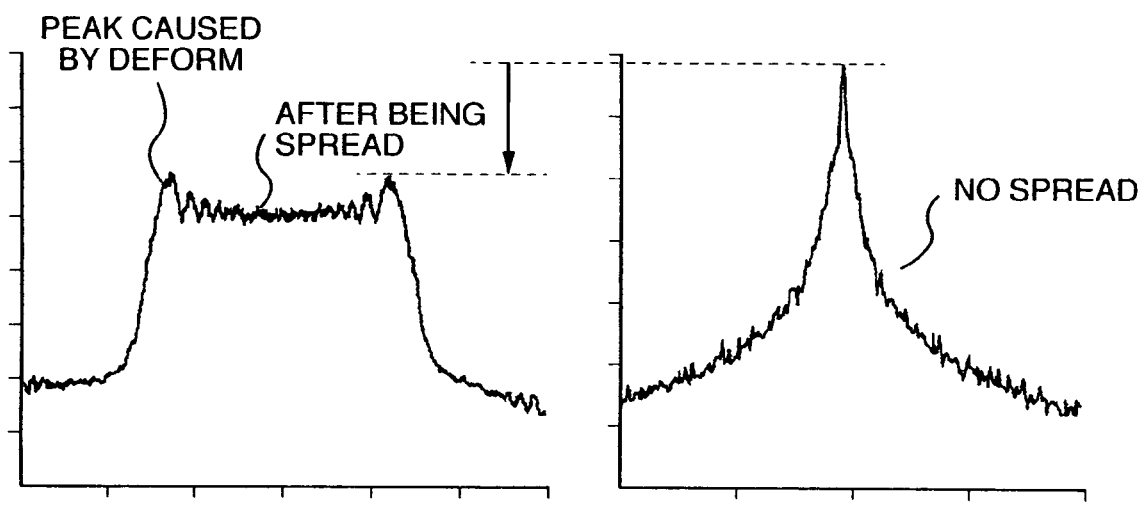
FIG. 12 shows a frequency spectrum waveform diagram by a single modulation profile.

FIG. 12 represents a frequency spectrum diagram by a single modulation profile. In this drawing, both a spectrum waveform which is not spread, and such a spectrum waveform are represented which has been spread by the single frequency modulation profile 23 as represented in FIG. 7, and only the base wave of which has passed through the loop filter 3. In the single frequency modulation profile 23, the spectrum is spread, so that the peak is attenuated. However, peaks are produced at both edges (namely, folded portion of frequency modulation profile 23) of the spectrum after being spread, so that the attenuation effect is reduced.

Figure 13:
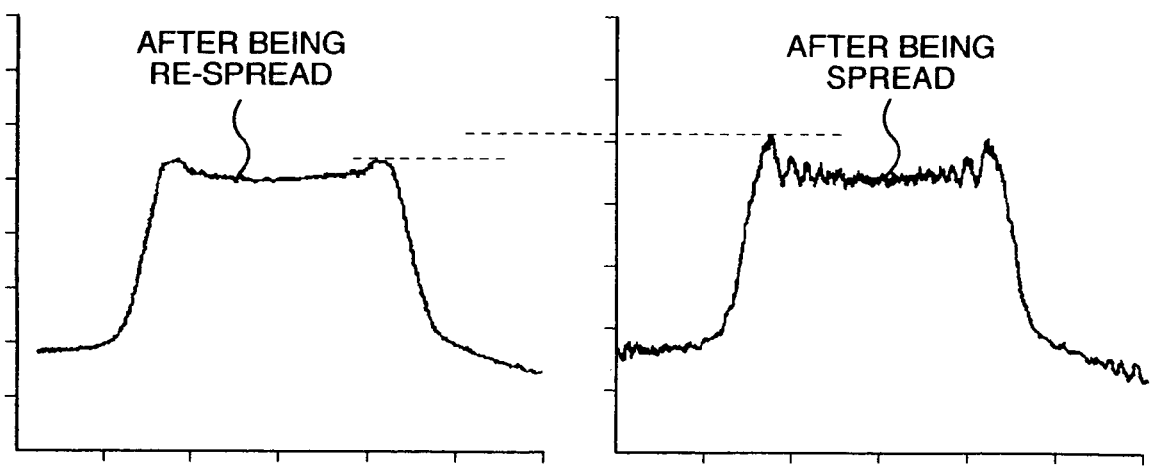
FIG. 13 indicates a spectrum waveform diagram by such a multiple modulation profile shown in FIG. 1 and FIG. 2.

FIG. 13 shows a spectrum waveform diagram based upon the multiple modulation profiles as represented in FIG. 1 and FIG. 2. Since a frequency degree is reduced to ¼ due to the re-spreading operation by the up/down counter 14, a peak itself of the spectrum is attenuated by 6 dB.

Figure 14:
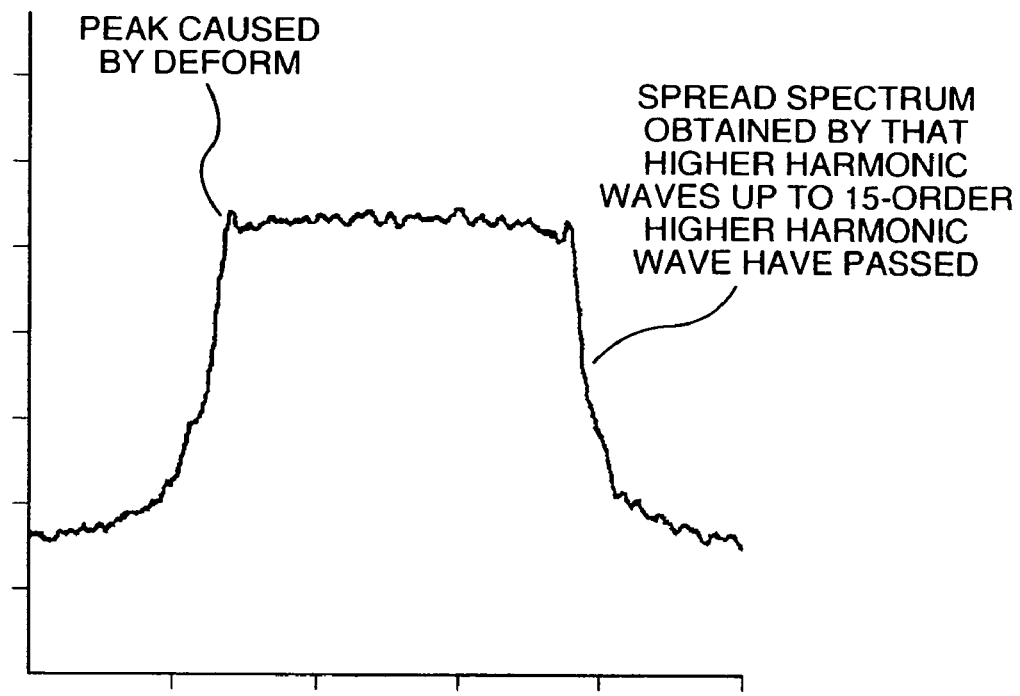
FIG. 14 represents a spectrum waveform diagram used for a comparison with respect to the present invention.

FIG. 14 shows a spectrum waveform diagram for showing that the spectrum is spread by the single frequency modulation profile 23, when the loop filter 3 which can pass through waveforms up to a 15th order high harmonic wave is used, for the sake of comparison with the present invention. In the single frequency modulation profile 23, peaks are produced at both edges (namely, folded portion of frequency modulation profile 23) of the spectrum after being spread, so that an attenuation effect is reduced. In the event a similar effect of this is invention is to be obtained by utilizing a single frequency modulation profile 23, a loop filter 3 which can pass therethrough the waves up to the 15-th order higher harmonic wave is required.

The above-described embodiment is featured as follows: That is, since the turning point of the modulation profile is intentionally changed along the amplitude direction within the range of the frequency modulation, the stagnation point of the modulated frequency of the turning portion is moved and dispersed which constitutes the occurring cause of the peaks, and the re-spread of the peaks produced at both edges of the spread spectrum is realized, so that the peaks are reduced.

In this specification, the intentional change of the turning point of the modulation profile owns the following meaning. That is, with respect to such a modulation profile (above-described frequency modulation profile) which is used to be frequency-modulated, the turning point of the frequency modulation profile is moved by such a modulation profile whose time period is longer than that of the frequency modulation profile, for instance, a triangular wave (above-explained re-spread profile) which is varied larger than, or equal to 1 step within 1 time period of the frequency modulation profile, and multiple modulation is performed in such a manner that the stagnation points of the modulated frequency are not overlapped with each other. As to the re-spread profiles, a lower limit re-spread profile need not be equal to an upper limit re-spread profile, but also, an arbitrary shape (for example, sawtooth wave and sine wave) other than the triangular wave (re-spread purpose modulation profile 20) shown in FIG. 4 may be selected. The step number which is varied may be expressed by repeating an arbitrary sequence. For example, a repetition of 1 up, 1 up, 1 down, and 1 down may be employed. As another example, a repetition of 1 up, 2 up, 2 down, 1 down, 2 up, and 2 down may be employed.

Also, the same effect may be achieved by the following manner. That is, for example, the turning point of the frequency modulation profile is moved one time for a time period longer than, or equal to 1 time period of the frequency modulation profile by way of random numbers (will be explained later) along the amplitude direction within the frequency modulation range in an irregular mode, so that the stagnation point of the modulated frequency is moved in the irregular mode, and thus, the same effect may be achieved without applying the frequency components by the multiple modulation.

Since the multiple modulation profile generating circuit according to the present invention is employed, the spectrum peaks produced at the stagnation points of the modulated frequency in the spectrum after being spread can be re-spread, and thus, the spectrum peaks after being spread can be lowered. Both the move amount and the move range of the stagnation point of the modulated frequency can be changed, and thus, the width of the re-spreading operation can be changed in response to the spectrum peak.

As previously explained, for instance, the stagnation point of the frequency change is simply moved by 3 stages, while this frequency has been modulated by the re-spread profile of such a triangular wave which is changed by 1 step one time within 1 time period of the frequency modulation profile (namely, by such a change amount that step amount equal to 5% amplitude of frequency modulation profile is defined as 1 step). A frequency degree of the stagnation point at this time becomes equal to ⅓ frequency degree obtained in the case that the spectrum peak is not re-spread, and the peak produced in the spectrum after being spread is attenuated by 4.7 dB. When the stagnation point of the modulated frequency is moved by 6 stages, a frequency degree of the stagnation point at this time becomes ⅙ frequency degree, and the peak itself as to the spectrum after being spread is attenuated by 7.5 dB.

Since the inventive idea of the present invention is applied to both a clock generating method and a clock generating circuit, even in such a spectrum spread clock oscillator having a loop band for attenuating a higher harmonic wave of a frequency modulation profile, in which a modulation frequency passes through a loop filter, a spectrum peak produced at a stagnation point of a modulated frequency can be re-spread, and also, the spectrum peak after being spread can be lowered.

Since the multiple modulation profile generating circuit of the present invention is employed, in such a spectrum spread clock oscillator that a control voltage of a voltage-controlled oscillator is directly controlled by converting modulation profile data derived from a modulator into an analog modulation profile signal by a DAC (Digital-to-Analog Converter), even if resolution used to follow up the frequency modulation is lowered with respect to the frequency modulation profile, the same spread attenuation effect may be obtained. As a result, an absolute value of either a reference current or a reference voltage of the above-described DAC can be lowered. As a consequence, current consumption of the spectrum spread clock oscillator can be lowered. Also, the oscillation gain of the voltage-controlled oscillator can be increased, so that an effect capable of widening the oscillation range can be achieved.

FIG. 3 is a block diagram for schematically indicating another embodiment of the multiple modulation profile generating circuit 7 according to the present invention. The multiple modulation profile generating circuit 7 of this embodiment is arranged by a subtractor 15, a comparator 16, an up/down counter 17, a random numbers generator 18, and a register 19. The multiple modulation profile generating circuit 7 of this embodiment is operated by receiving a reference clock and an up/down switching signal of the up/down counter 17 as clock signals. The up/down counter 17 corresponds to a circuit which outputs a modulation profile for a frequency spreading operation. This up/down counter 17 controls either a count-up operation or a count-down operation in response to either a count-up switching signal or a count-down switching signal, which are outputted from the comparator 16. The comparator 16 corresponds to such a circuit which compares the count output of the up/down counter 17 with a comparison judging value which is produced from the output of the register 19. This register 19 holds therein re-spread data used to re-spread a peak of a spread spectrum.

A minimum comparison value used to switch the counting operation of the up/down counter 17 into the count-up operation is assumed as the output value of the register 19. A maximum comparison value used to switch the counting operation of the up/down counter 17 into the count-down operation is assumed as such a value obtained by subtracting the output value of the register 19 from such a maximum value (maximum comparison value) which can be outputted by the up/down counter 17. The register 19 corresponds to such a circuit which holds a value outputted by the random numbers generator 18 until the switching signal of the comparator 16 is changed. In other words, both the comparator 13 and the up/down counter 14 shown in FIG. 2 are replaced by both the random numbers generator 18 and the register 19 shown in FIG. 3.

Figure 5:
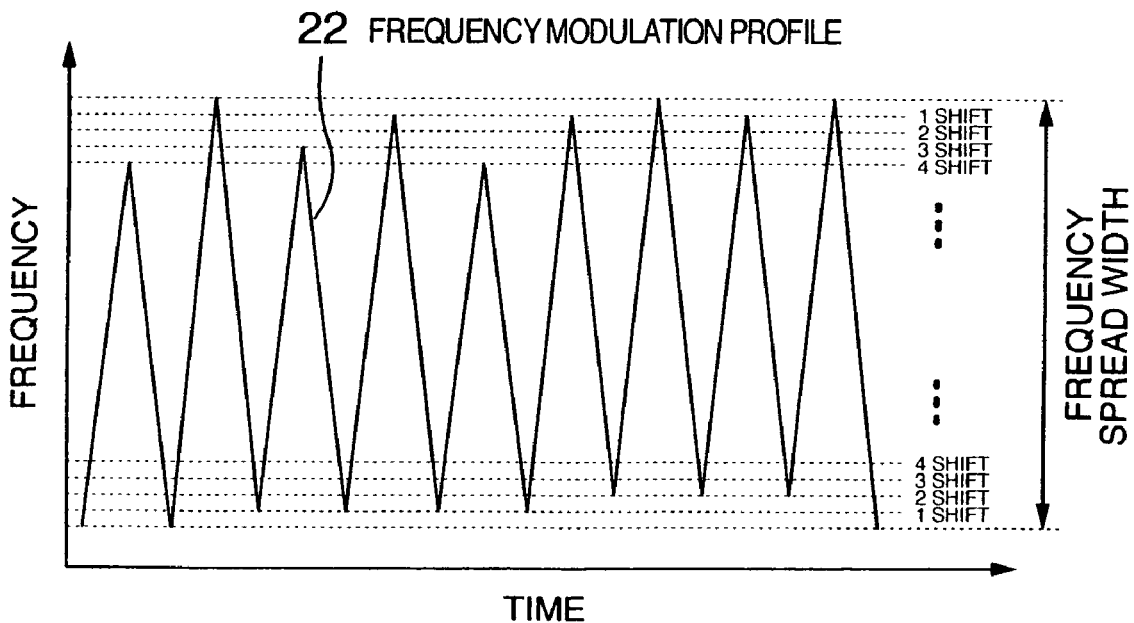
FIG. 5 is an explanatory diagram for explaining a multiple modulation profile which is outputted by the multiple modulation profile generating circuit 7 of FIG. 3.

FIG. 5 is an explanatory diagram for explaining a multiple modulation profile which is outputted by the multiple modulation profile generating circuit 7 shown in FIG. 3. Assuming now that a minimum value of the random numbers of the multiple modulation file generating circuit 7 is equal to 0 and a maximum value thereof is equal to 4, when a maximum comparison value corresponds to a frequency spread width, re-spread purpose data is outputted from the register 19, whereas a frequency modulation profile 22 is outputted from the up/down counter 17. In such a case that the stagnation point of the modulated frequency is re-spread to be dispersed in an average manner, since a frequency degree is reduced to ¼, a peak itself of the spectrum is attenuated by 12 dB.

Figure 9:
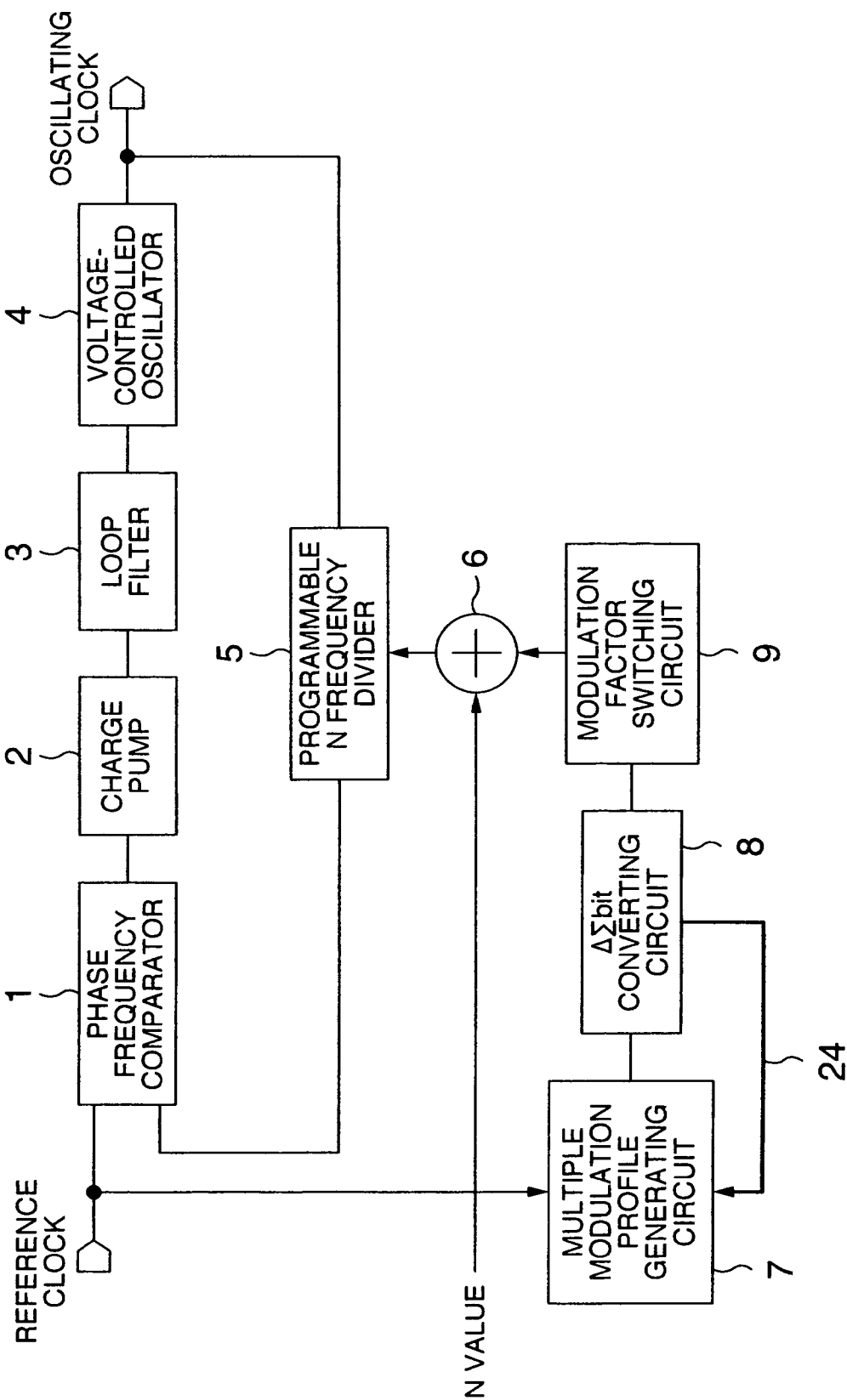
FIG. 9 is a schematic block diagram for showing another embodiment of the clock generating circuit according to the present invention.

FIG. 9 is a schematic block diagram for indicating another embodiment of a clock generating circuit according to the present invention. The clock generating circuit is arranged by adding a modulator to a PLL circuit which is similarly constituted by a phase frequency comparator 1, a charge pump 2, a loop filter 3, a voltage-controlled oscillator 4, and a programmable N frequency divider 5, while the modulator is constituted by an adder 6, a multiple modulation profile generating circuit 7, a ΔΣbit converting circuit 8, and a modulating factor switching circuit 9. The above-described ΔΣbit converting circuit 8 outputs re-spread purpose data 24 which is to generate a re-spread purpose profile.

Figure 10:
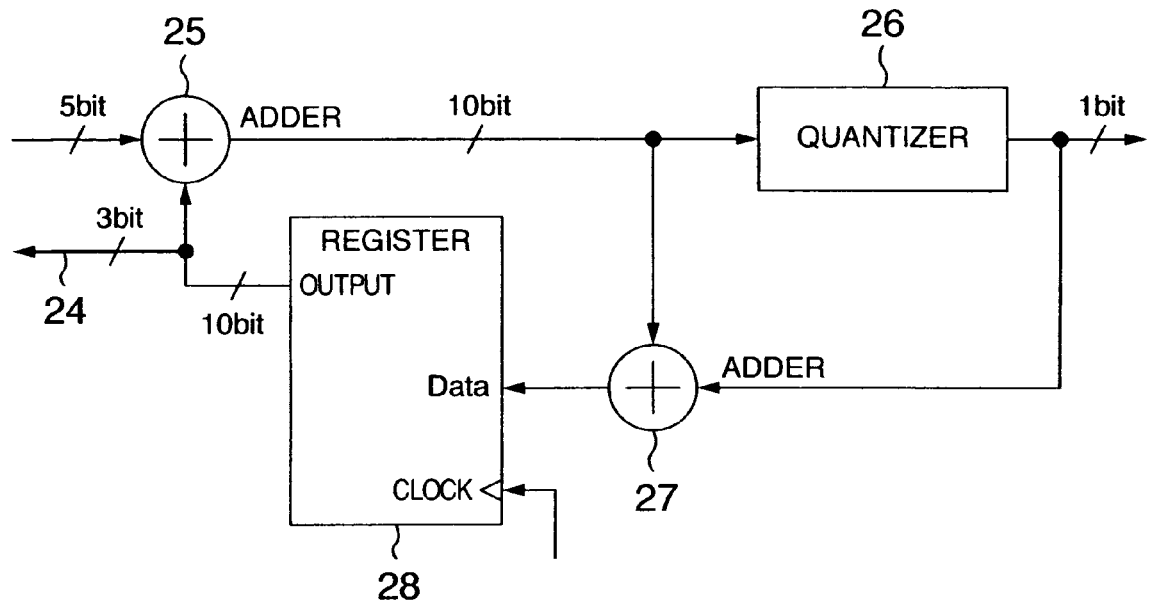
FIG. 10 is a schematic block diagram for representing one embodiment of a ΔΣbit converting circuit shown in FIG. 9.

FIG. 10 is a schematic block diagram for showing an embodiment of the ΔΣbit converting circuit 8 shown in FIG. 9. The ΔΣbit converting circuit 8 is constituted by an adder 25, a quantizer 26, another adder 27, and a register 28, and corresponds to a 1-bit pulse width modulating circuit which bit-converts the multiple modulation profile outputted by the multiple modulation profile generating circuit 7 into 1 bit.

As the re-spread purpose data 24, for instance, 3 bits are arbitrarily selected from arbitrary bits within the output of 10 bits from the register 28 to be outputted. Alternatively, as the re-spread purpose data 24, 3 bits may be arbitrarily selected from arbitrary bits within the output of the adder 25, or the output of the adder 27. In this embodiment, an example of a first-order ΔΣbit converting circuit has been represented. Alternatively, the ΔΣbit converting circuit may be realized by second-order, or higher-order ΔΣbit converting circuits. Also, the re-spread purpose data 24 need not be 3 bits, but the respective bits may be alternatively rearranged with each other.

Figure 11:
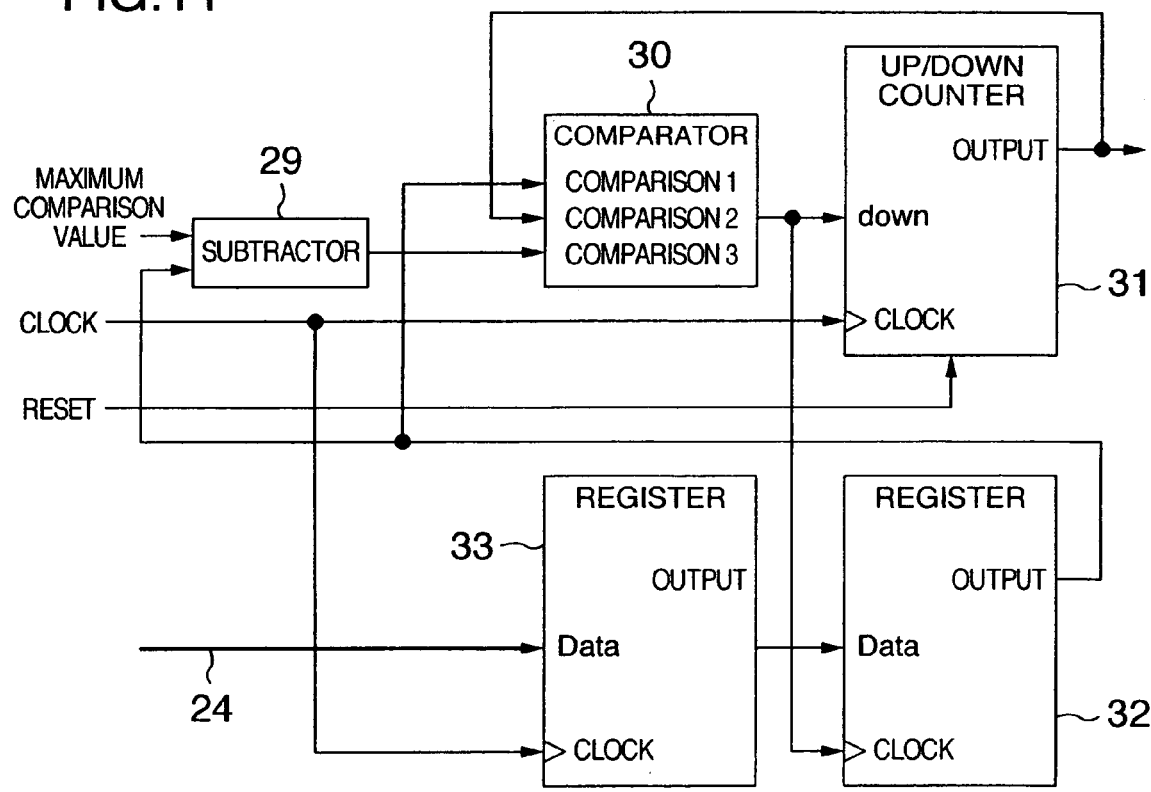
FIG. 11 is a schematic block diagram for indicating one embodiment of the multiple modulation profile generating circuit 7 shown in FIG. 9.

FIG. 11 is a block diagram for schematically indicating one embodiment of the multiple modulation profile generating circuit 7 shown in FIG. 9. The multiple modulation profile generating circuit 7 of this embodiment is arranged by a subtractor 29, a comparator 30, an up/down counter 31, a register 32, and a register 33. While the multiple modulation profile generating circuit 7 of this embodiment inputs a reference clock, the multiple modulation profile generating circuit 7 is operated by receiving an up/down switching signal of the up/down counter 31 as a clock signal. The up/down counter 31 corresponds to a circuit which outputs a modulation file for a frequency spreading operation. This up/down counter 31 controls either a count-up operation or a count-down operation in response to either a count-up switching signal or a count-down switching signal, which are outputted from the comparator 16.

The comparator 30 corresponds to such a circuit which compares the count output of the up/down counter 31 with a comparison judging value which is produced from the output of the register 32. This register 32 holds therein re-spread data used to re-spread a peak of a spread spectrum. In this case, a minimum comparison value used to switch the counting operation of the up/down counter 31 into the count-up operation is assumed as the output value of the register 32. A maximum comparison value used to switch the counting operation of the up/down counter 31 into the count-down operation is assumed as such a value obtained by subtracting the output value of the register 32 from such a maximum value (maximum comparison value) which can be outputted by the up/down counter 31. The register 33 corresponds to such a circuit which holds the value of the re-spread purpose data 24 outputted by the ΔΣbit converting circuit 8, and also, corresponds to such a circuit which holds the value until the comparison signal of the comparator 30 is changed.

Figure 15:
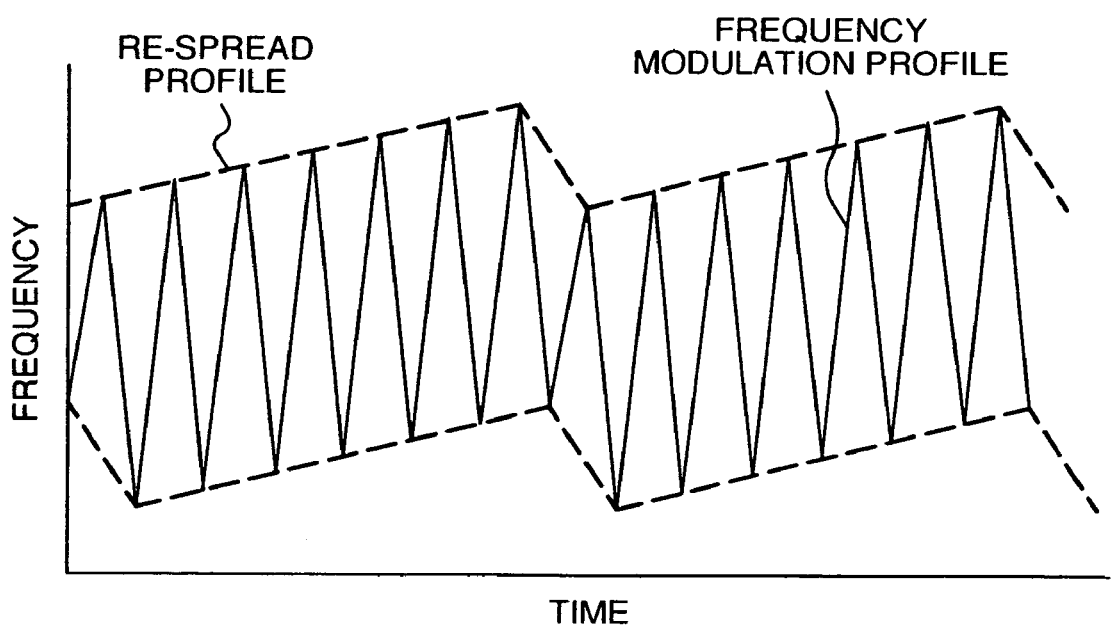
FIG. 15 is an explanatory diagram for explaining a multiple modulation profile which indicates a modification of the present invention.
Figure 16:
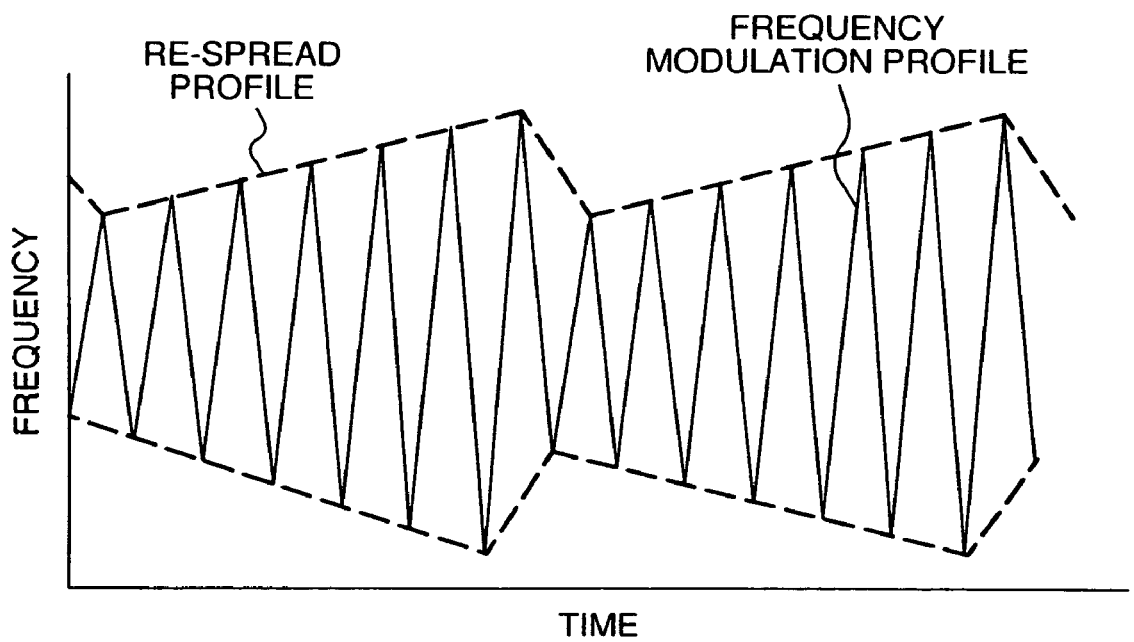
FIG. 16 is an explanatory diagram for explaining a multiple modulation profile which shows another modification of the present invention.
Figure 17:
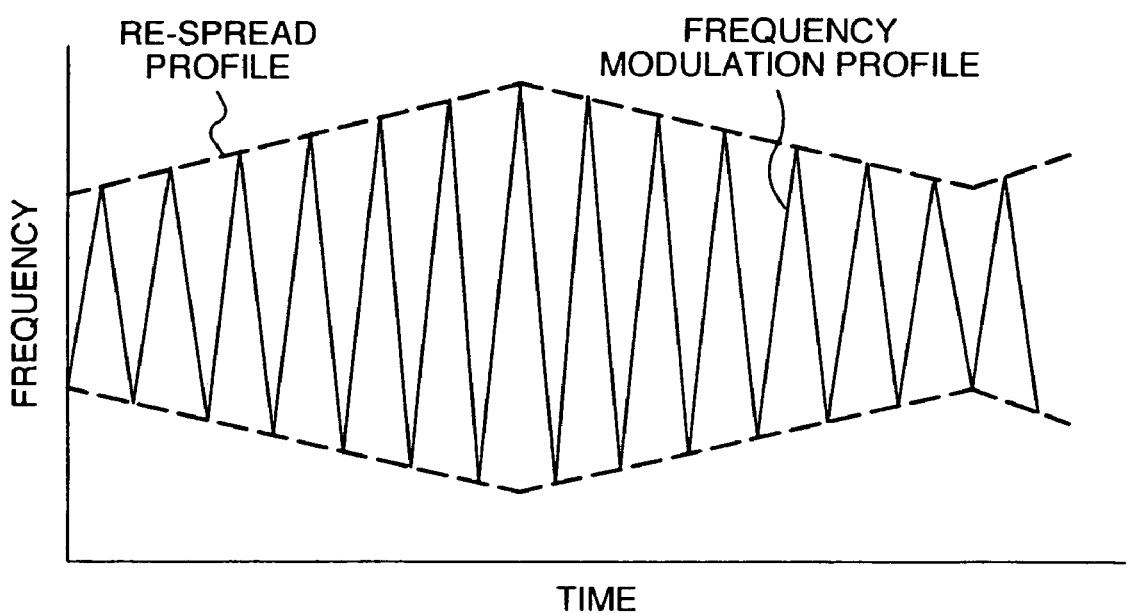
FIG. 17 is an explanatory diagram for explaining a multiple modulation profile which indicates another modification of the present invention.
Figure 18:
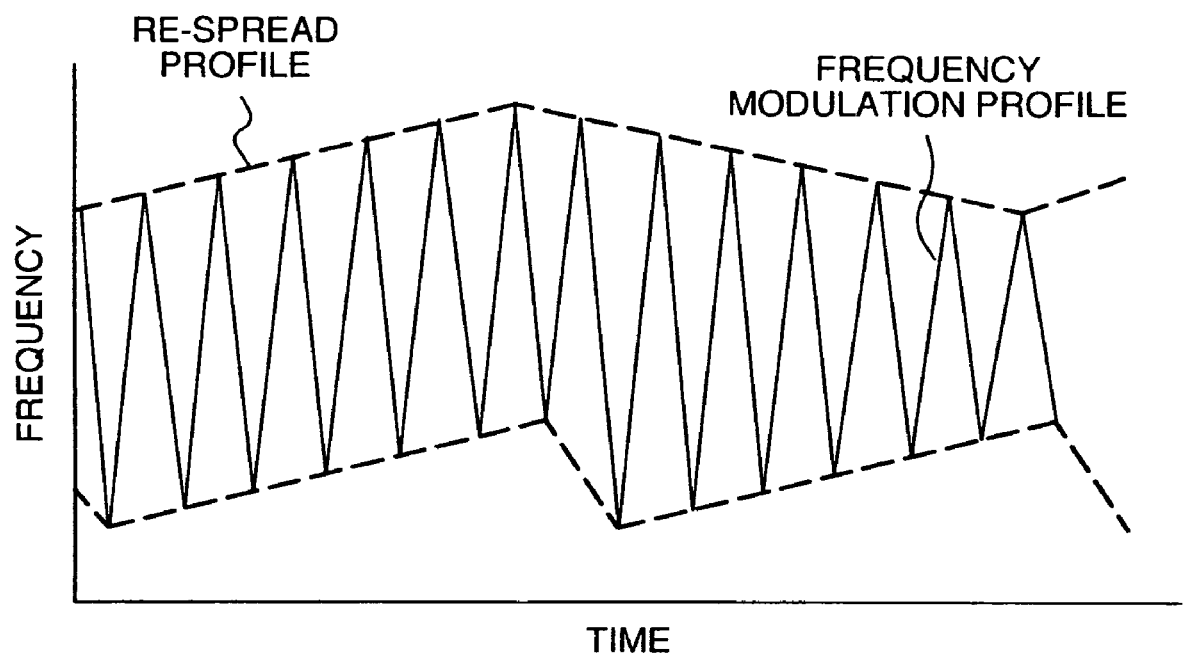
FIG. 18 is an explanatory diagram for explaining a multiple modulation profile which shows another modification of the present invention.

In the above-explained embodiment, while the subtractor is employed, both sides of the turning point of the modulation profile have been moved by the same move amounts. Alternatively, both the move amount and the move range may be arbitrarily changed, as well as only one side of the turning point of the modulation profile may be moved. In other words, various sorts of embodiment modes may be alternatively employed, e.g., an embodiment mode for employing a re-spread profile using such a saw-tooth wave as shown in FIG. 15; another embodiment mode for employing another re-spread profile using such a saw-tooth wave as represented in FIG. 16; another embodiment mode for employing another re-spread profile using such a triangular wave as indicated in FIG. 17; another embodiment mode for employing another re-spread profile using such a combination between a saw-tooth wave and a triangular wave as shown in FIG. 18, and the like. Further, although the embodiment using the up/down counter has been described as the spread profile generating method, such a result obtained by being bit-converted by the ΔΣbit converting circuit and by being re-modulated may be alternatively employed in order to remove the periodic characteristic.

While the invention made by the Inventors of the present invention has been described in the concrete manner based upon the embodiments, the present invention is not limited only to these embodiments. Accordingly, the present invention may be apparently modified, or changed without departing from the technical scope and spirit of the invention. For example, a voltage-controlled oscillator, such an oscillator may be alternatively realized which employs a differential amplifier which is constituted by a voltage/current converter and a ring oscillator, and in which an operating current corresponding to the control current flows through the ring oscillator. Further, the voltage-controlled oscillator may be alternatively realized by employing a CMOS inverter circuit. In the voltage-controlled oscillator with employment of the CMOS inverter circuit, both a P-channel MOSFET and an N-channel MOSFET, which are current-controlled, are series-connected to a P-channel MOSFET and an N-channel MOSFET respectively, which constitute the CMOS inverter circuit so as to control a delay time occurred in the inverter circuit stage, so that the ring oscillator may be arranged. The present invention can be widely utilized as clock generating methods and clock generating circuits, capable of reducing EMI.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A clock generating circuit comprising:
a PLL (Phase-Locked Loop) circuit and a modulator,
wherein a frequency dividing ratio of a feedback-purpose frequency divider in said PLL circuit is changed in accordance with modulation data produced based upon a modulation profile of said modulator to perform a frequency modulation whereby a spectrum is spread,
wherein said modulator comprises a multiple modulation profile generating circuit, and moves a turning point of said modulation profile so as to disperse a degree of frequency,
wherein said modulator further comprises:
a ΔΣbit converting circuit; and
a modulation factor switching circuit,
wherein said ΔΣbit converting circuit performs a pulse width modulation by which a multiple modulation profile outputted by said multiple modulation profile generating circuit is converted into 1 bit, and
wherein said modulation factor switching circuit switches a frequency spread width which is determined based upon both the frequency dividing ratio of said feedback-purpose frequency divider and a value which is added to said frequency dividing ratio in response to the output of said ΔΣbit converting circuit.

2. A clock generating circuit as claimed in claim 1 wherein:
said multiple modulation profile generating circuit comprises:
a subtractor, a first comparator, a second comparator, a first up/down counter, and a second up/down counter;
said first up/down counter performs either a count-up operation or a countdown operation for a reference clock in response to either a count-up switching signal or a countdown switching signal, which are outputted by said first comparator, so as to output a modulation profile for a frequency spread;
said second up/down counter performs a counting operation of the output from said first comparator in response to either a count-up switching signal or a count-down switching signal outputted from said second comparator which compares both a minimum shift value and a maximum shift value, which determine a range of a re-spread, with output of the second up/down counter; and
said first comparator receives the output signal of said second up/down counter as a minimum comparison value, and also receives, as a maximum comparison value, an output signal which is obtained by subtracting the output signal of said second up/down counter from a predetermined maximum comparison value, so as to control the counting operation of said first up/down counter.

3. A clock generating circuit as claimed in claim 1 wherein:

said multiple modulation profile generating circuit comprises:

a subtractor, a comparator, a random number generator, an up/down counter, and a register, said up/down counter performs either a count-up operation or a count-down operation for a reference clock in response to either a count-up switching signal or a count-down switching signal, which are outputted by said first comparator, so as to output a modulation profile for a frequency spread;

said register acquires random numbers generated by said random number generator in accordance with a count-up switching signal and a count-down switching signal, which are outputted from said comparator; and said comparator receives the output signal of said register as a minimum comparison value, and also receives as a maximum comparison value, such an output signal which is obtained by subtracting the output signal of said register from a predetermined maximum comparison value, so as to control the counting operation of said up/down counter.

4. A clock generating circuit as claimed in claim 1 wherein:

said $\Delta\Sigma$bit converting circuit comprises:

a first adder, a second adder, a quantizer, and a register, and said $\Delta\Sigma$bit converting circuit selects an arbitrary bit from an output of said register, and feeds back said selected bit to said multiple modulation profile generating circuit as re-spread purpose data;

said multiple modulation profile generating circuit comprises:

a subtractor, a comparator, an up/down counter, a first register, and a second register;

said up/down counter performs either a count-up operation or a count-down operation for a reference clock in response to either a count-up switching signal or a count-down switching signal, which are outputted by said first comparator, so as to output a modulation profile for a frequency spread;

said first register acquires the re-spread purpose data formed by said $\Delta\Sigma$bit converting circuit in accordance with said reference clock;

said second register acquires the output signal of said first register in accordance with both the count-up switching signal and the count-down switching signal, which are outputted by said comparator; and said comparator receives the output signal of said second register as a minimum comparison value, and also receives as a maximum comparison value, such an output signal which is obtained by subtracting the output signal of said second register from a predetermined maximum comparison value, so as to control the counting operation of said up/down counter.

\* \* \* \* \*